(12) United States Patent
Vecchione et al.

(10) Patent No.: US 8,062,976 B2
(45) Date of Patent: Nov. 22, 2011

(54) LOW COST METHOD OF FABRICATION OF VERTICAL INTERCONNECTIONS COMBINED TO METAL TOP ELECTRODES

(75) Inventors: Raffaele Vecchione, Naples (IT); Luigi Giuseppe Occhipinti, Ragusa (IT); Nunzia Malagnino, Torre Annunziata (IT); Rossana Scaldaferri, Sapri (IT); Maria Viviana Volpe, Pozzuoli (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 12/844,347

(22) Filed: Jul. 27, 2010

(65) Prior Publication Data

US 2011/0027986 A1 Feb. 3, 2011

(30) Foreign Application Priority Data

Jul. 28, 2009 (IT) .............................. VA2009A0054

(51) Int. Cl.
*H01L 21/4763* (2006.01)
(52) U.S. Cl. ......... 438/673; 438/637; 438/638; 438/672
(58) Field of Classification Search .......... 438/618–624, 438/637–638, 672–673, 700
See application file for complete search history.

(56) References Cited

U.S. PATENT DOCUMENTS

| 5,254,872 | A  | * | 10/1993 | Yoda et al. ..................... 257/751 |
| 7,375,774 | B2 | * | 5/2008  | Tanaka et al. ................... 349/47  |
| 2005/0026421 | A1 |   | 2/2005  | Tanaka et al. ................. 438/622  |
| 2005/0142871 | A1 | * | 6/2005  | Liu et al. ....................... 438/674 |

FOREIGN PATENT DOCUMENTS

| WO | 01/47044    | 6/2001 |
| WO | 02/29912    | 4/2002 |
| WO | 2006/061589 | 6/2006 |

* cited by examiner

*Primary Examiner* — Dung A. Le
(74) *Attorney, Agent, or Firm* — Lisa K. Jorgenson; Allen, Dyer, Doppelt, Milbrath & Gilchrist, P.A.

(57) ABSTRACT

A method is for forming a vertical interconnection through a dielectric layer between upper and lower electrically conductive layers of an integrated circuit. The method includes forming an opening through the dielectric layer and placing a solidifiable electrically conductive filler into the opening via a printing technique. The solidifiable electrically conductive filler is solidified to thereby form a solidified electrically conducting filler in the opening. A metallization layer is formed over the dielectric layer and the solidified electrically conducting filler to thereby form the vertical interconnection through the dielectric layer between the upper and lower electrically conductive layers of the integrated circuit.

30 Claims, 6 Drawing Sheets

LOW COST METHOD OF FABRICATION OF VERTICAL INTERCONNECTIONS COMBINED TO METAL TOP ELECTRODES

FIELD OF THE INVENTION

This invention relates, in general, to electronics, and, in particular, to microelectronics and related process of microfabrication. More particularly, this invention relates to a process for forming vertical interconnections in an integration stack associated with upper electrodes of metallic material to be defined in a patterned metal layer of the stack.

BACKGROUND OF THE INVENTION

Various examples of the fabrication of P channel and N channel organic transistors (OTFT) through deposition processes using a chemical vapor or solution, onto glass, silicon, or substrates of organic polymers, as described in Tsumura, A.; Koezuka, K.; Ando T.: Macromolecular electronic device: Field-effect transistor with a polythiophene thin film. *Appl. Phys. Lett.,* 1986, 49, 1210, Kwon, J.-H.; Seo, J.-H.; Shin, S.-I.; Kim, K.-H.; Choi, D. H.; Kang, I. B.; Kang, H.; Ju, B.-K.: A 6,13-bis(Triisopropylsilylethynyl) Pentacene Thin-Film Transistor Using a Spun-On Inorganic Gate-Dielectric, *IEEE Trans. On Electron Devices.,* 2008, 55-2, 500-505, and Yan, H.; Chen, Z.; Zheng, Y.; Blache, R.; Newman, C.; Lu, S.; Woerle, J.; Facchetti, A.: Solution Processed Top-Gate n-Channel Transistors and Complementary Circuits on Plastics Operating in Ambient Conditions, *Adv. Materials,* 2008, 20, 3393-3398, are known in the art. For practical applications, a fabrication process provides a method for electrically connecting elements of an integrated structure of an OTFT formed in different conducting layers at different levels of the multilayered stack. For example, vertical interconnections may be realized from a first level, in which there may be source and drain contacts of one or more OTFT, to a second level in which there may be gate contacts of one or more OTFT. In other words, it is desirable to connect circuit nodes or contacts on a same level with those on different levels, thereby realizing vertical interconnections that go from a lower level conductive region or to an upper level of metal contacts (so called "vias" or "via holes") crossing one or more dielectric layers of the multi-layer integration stack.

In this way it is possible to realize complex devices, such as logic gates, that are building blocks of memory devices, of data processing units (ALU and microprocessors), driving systems for various types of devices, such as sensors and actuators and alikes.

Vertical interconnections or vias are typically realized inside vias holes formed through the polymeric material of isolation dielectric layers, using an appropriate definition technique such as Ink Jet Printing (IJP), Laser Ablation (LA) and Reactive Ion Etching (RIE). In the first case, a solvent is used to dissolve the polymeric material locally through an IJP deposition, as described in Takeo Kawase et al.: Inkjet Printed Via-Hole Interconnections and Resistors for All-Polymer Transistor Circuits, Adv. Mater. 2001, 13, No. 21, November 2. In the second case, via holes are formed by ablation of the polymeric material, that is using a laser beam that, through apertures of a mask, vaporizes away the polymeric material producing a certain number of via holes, as described in U.S. Pat. No. 6,259,148—Modular high frequency integrated circuits structure issued on Jul. 10, 2001 In the third case, a mask is formed by photolithography over the surface of the layer of polymeric material and thence a RIE etching, typically oxygen-based RIE is carried out, through the apertures of the mask as described in I. Mejia et. A.: Improved Upper Contacts PMMA On P3HT PTFTS Using Photolithographic processes, *Microelectronics Reliability* 48, 2008, 1795-1799.

After having realized the via holes, two different approaches may be used for filling them with a conducting material, realizing in this way the vertical interconnections. The first approach involves a localized deposition by IJP, inside the holes, of a functional ink based on a polymeric conducting material, such as the so called PEDOT:PSS (Poly (3,4-ethylenedioxythiophene)-poly(styrenesulfonate)), or of an equivalent ink jet printable fluid material, such as a colloidal suspension of metal nanoparticles, or a colloidal suspension of an organometallic salt or compound. In case of use of colloidal suspensions of metal nanoparticles, generally gold and/or silver nanocluster are used, passivated by organic agents such as thiols, amines, or phosphines with a long hydrocarbon chain for keeping the suspension of nanoparticles homogeneous and hindering early undue aggregation phenomena to bulk metal. Generally, in the case of inks based on metal nanoparticles as well as in case of solutions of metal precursors, deposition of the ink is followed by a heat, UV, or laser irradiation treatment, for decomposing the organic component of the fluid ink and favor sintering of metal nanoparticles or inducing their formation from the precursor compound and successively promoting the coalescence into bulk metal as described in Daniel Huang et al. *Journal of The Electrochemical Society,* 150 (7) G412-G417 2003; Sawyer B. Fuller et al. *Journal Of Microelectromechanical Systems,* Vol. 11, No. 1, February 2002, 54-60; N. R. Bieri, et al. *Appl. Phys. Lett.,* Vol. 82, No. 20, 19 May 2003, 3529-3531; Jaewon Chung, et al. *Appl. Phys. Lett.,* Vol. 84, No. 5, 2 Feb. 2004 pp 801-803; Jai Joon Leea, et al. *Journal of Ceramic Processing Research.* Vol. 8, No. 3, 2007, 219-223; K. F. Teng, et al. *Ieee Transactions on Components Hybrids, and Manufacturing Technology,* vol. Chmt-12, No. 4, 1987.

Upper electrodes in contact with the vertical interconnections generally are made by IJP deposition of the same material with which the vias are made as described in T. Kawase. Et al. *IEEE IEDM* 2000, 623-626; A. Knobloch, et al. *IEEE Session* 4: Polymer Electronic Devices II, 84-90. Definition of upper electrodes by IJP printing limits the scalability of devices. As a matter of fact, the minimum dimension that may be obtained in general with localized deposition techniques is around 20 µm. Therefore, the printing techniques of definition of planar conducting structures, particularly the upper electrodes of integrated structures of organic transistors (OTFT), imply constraints of minimum line width of the particular printing technique that is used.

In the cases in which this limit to scalability is unacceptable, instead of localized deposition with a printing technique, a "soft" metal deposition technique is used producing a massive metallization of the surface of the stack such to completely fill the vias holes of vertical interconnections and form a superficial metallization layer without discontinuities, that is successively lithographically printed to define the upper electrodes and lines of electrical connection of the device. A drawback of this technique is that there is a considerable waste of metal and the risk of damaging delicate organic layers of the stack during the prolonged (heavy) metal deposition and/or during the etching of the metal layer.

SUMMARY OF THE INVENTION

A method is for realizing vertical contacts and/or interconnections associated with patterned metal lines of electrical connection and/or with conductive structural elements, like electrodes definable at a relative level of an integration stack, in a dimensional scale of integration much larger than that of the vertical contacts and/or interconnections through dielectric layers of the stack. The method allows a photolithographic definition of highly compact conductive metal structures in a relatively thin deposited metal layer of substantially uniform thickness, that may be freely designed within the constraints solely of photolitographically definable metal structures, because the metal layer deposition may not have to fill deep vertical interconnection vias and/or contacts openings through layer(s) of dielectric material(s), such as for example of an organic polymer.

According to the method, the vias are pre-filled with conducting material that is consolidated in situ from a paste or ink based on conducting polymers or based on colloidal particles of a metal or of a substance or chemical precursor compound applied with a common printing technique. Basically, the method includes in filling the vias with a conductive material consolidated in situ from a solution or suspension or a precursor compound thereof, deposited into the vias by an appropriate printing technique, for example by ink jet printing. The method also includes depositing a photolithographically definable metal layer over the surface of the dielectric layer and of the top surface of the filling of conductive material consolidated inside the vias, the metal layer being roughly co-planar to the surface of the dielectric layer.

A surface metallization realized with a common blanket metal deposition step onto a substantially planar and smooth surface, having already formed vertical interconnections with an appropriate printing technique, has been found to have an enhanced stability. It is also suited for high scalability fabrication processes because of the possibility of using high definition patterning techniques of the deposited metal layer, such as optical lithography, or non conventional lithography techniques such as Soft Lithography (SL) and Nano-Imprinting Lithography (NIL). Moreover, the use of conducting inks based on metal or conducting polymeric nanoparticles for filling the vias may reduce the need for a relatively massive metallization adapted to fill the vias, that is not only onerous but also risky for the dielectric layer directly exposed to such a planarizing metallization.

The use of metals of high electrical conductivity and reduced oxidability, such as gold and platinum, is preferable even if it is possible to use other metals, eventually realizing a passivating "encapsulation" of the metal structures after having defined them with the chosen optical or non conventional lithography technique, such as SL and NIL. Suitable filling materials of the vias may be conductive pastes or inks containing metal nanoparticles or conducting polymers. Conducting inks applicable by ink jet printing may be suspensions of metal nanoparticles, or preferably solutions of conducting polymers or even more preferably suspensions of conductors in an aqueous solution, as the commercial product denominated PEDOT:PSS.

Compared to the suspensions of metal nanoparticles, conducting polymers require even lower temperatures of thermal treatment after print deposition, and thus pose less risk for the active organic material contained in the device. Moreover, certain commercial conducting polymers, such as PEDOT:PSS, are available in aqueous base solutions, thus avoiding solubilization problems of already deposited organic materials that, in a particularly important exemplary embodiment herein disclosed, include the polymeric material of the insulating layer through which the vias have been formed and of the material at the bottom of the vias onto which the electrical contact is established.

The relatively smaller conductivity of conducting polymers than that of metals has little influence on the overall resistance of the interconnection in view of the fact that vias in organic polymeric stacks typically are at least twice larger than their depth. The novel method also comprises a vertical interconnection fabrication operation that employs two different techniques, that is a printing step followed by a consolidation treatment of the conducting filler material inside the vias. Thereafter, the method includes a deposition step of a superficial metal layer to be successively lithographically defined for patterning the required conducting portions. The advantages largely compensate the increased complexity of the method, from the point of view of the unrestrained scalability of metal structures such as upper electrodes of integrated OTFT structures, and a surprisingly low resistance of the vertical interconnections so established with two different materials, namely with a conductive via filled of an organic conductor or of consolidated metal particles, and with the surface deposited topping metal layer in electrical contact with the top surface of the filler.

DETAILED DESCRIPTION OF THE PREFERRED EMBODIMENTS

Figure 1A:
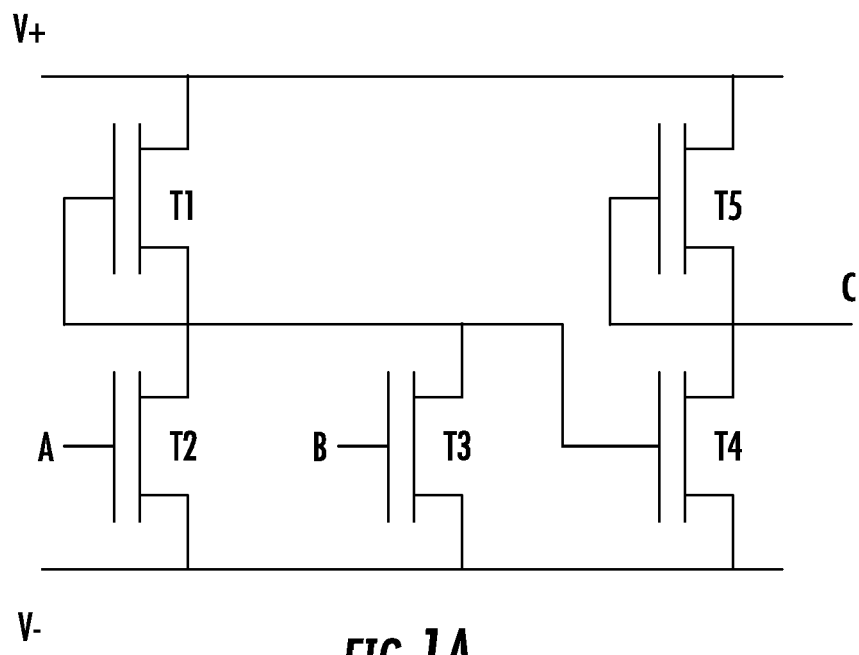
FIGS. 1A and 1B depict the electric scheme of a simple logic circuit and of an integration layout of the circuit in an organic polymeric stack, according to the present invention.
Figure 1B:
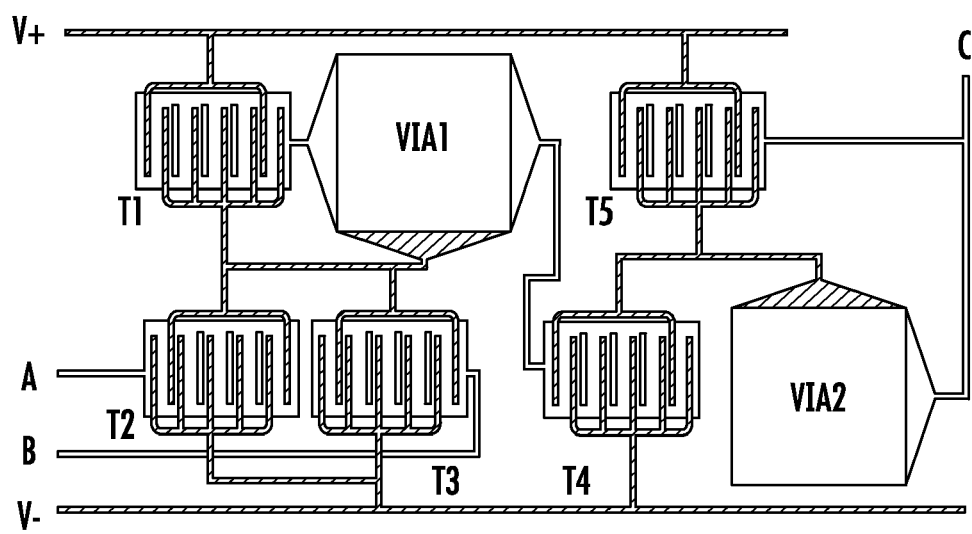
Figure 2A:
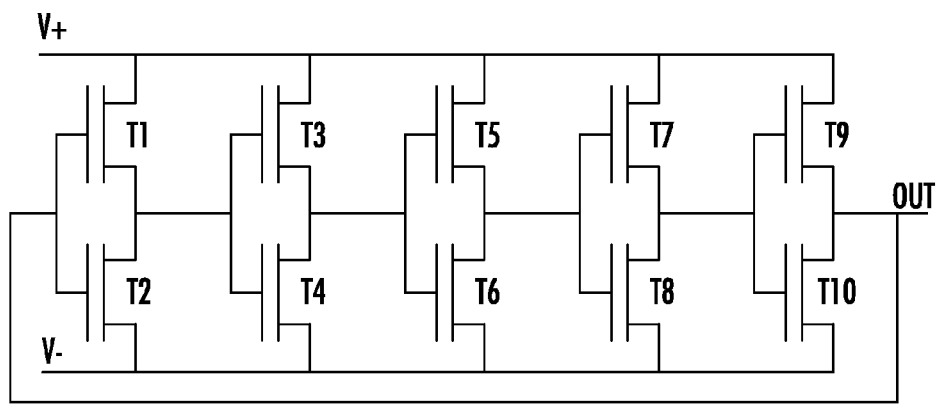
FIGS. 2A and 2B depict another electric scheme of a five-stages ring oscillator and of an integration layout of the circuit in an organic polymeric stack, according to the present invention.
Figure 2B:
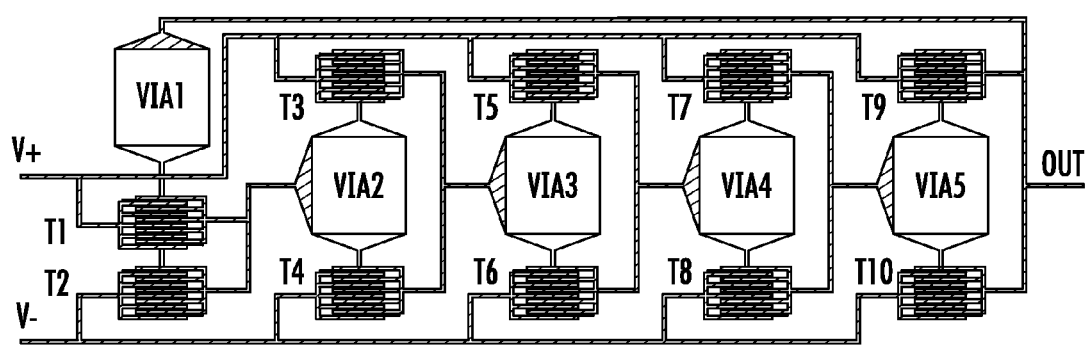

FIGS. 1 and 2 illustrate the electric diagram and an integration layout of a simple logic circuit and of a ring oscillator in an exemplary organic polymeric stack. The integrated structures of the OTFT transistors typically encompassing a plurality of levels of the stack employ, besides vertical interconnection vias between different levels of the stack, also a plurality of upper electrodes defined at the same level of relative conducting vias of the integrated circuit. The layout illustrates the practice of using a metallization layer adapted to be patterned by optical lithography or equivalent definition edge scale mold printing techniques that allows the patterning of conductive metal parts of micrometric or sub-micrometric widths in an integration scale of about an order of magnitude larger than that of parts definable with common printing techniques that show minimum patterning width of 20-40 micrometers. The layout shows how a "two-technologies" patterning according to this disclosure allows, on one hand, fabrication of integrated circuit devices having a very efficient and functionally effective layout in terms of integration area consumption (i.e. compactness of the integrated structures of OTFTs), and, on the other hand, allows avoidance of the major costs and criticalities of heavy metallization for filling the vias when depositing a metal layer that must successively be patterned by a high definition technique.

Figure 3:
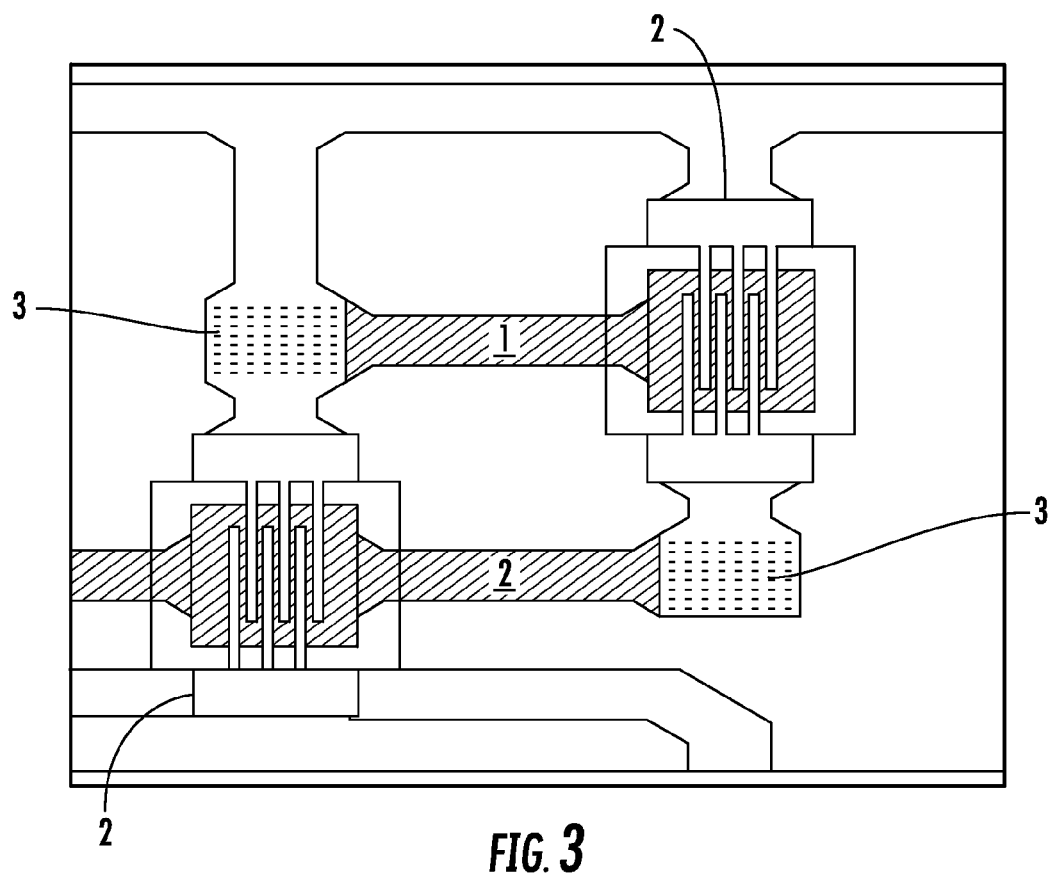
FIG. 3 depicts a logic circuit portion containing two OTFT transistors, showing an exemplary type of interconnections both on the metallization planes as well as vertically through an intervening organic incapsulating layer among different metal levels of the stack, according to the present invention.
Figure 4:
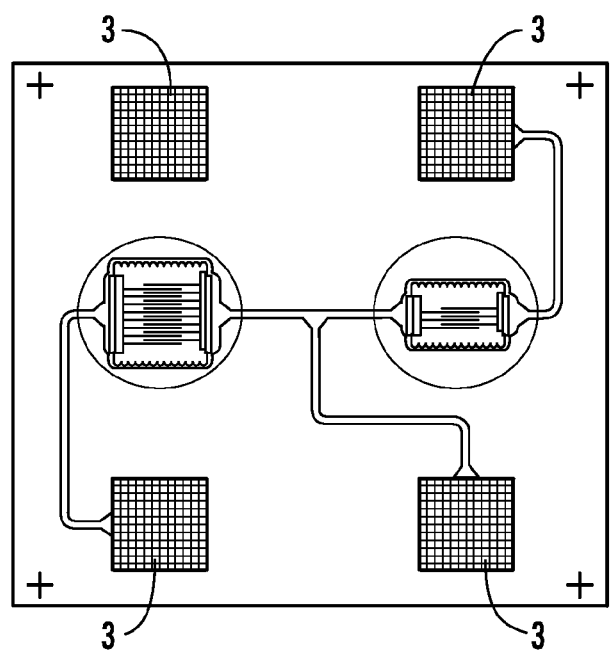
FIG. 4 is a picture taken with an optical microscope of a structure with four vias opened by RIE with $O_2$ plasma, according to the present invention.

For example, FIG. 3 depicts a portion of logic circuit containing two interconnected OTFT transistors, T1 and T2, as well as other circuit portions for example the supply pad CC, input IN, and output pads OUT defined in the same level metal of the upper contact 1 (red dashed line) and of lower 2 contact (yellow and gray line), respectively, crossing layers of the organic stack with vertical interconnections 3 (green), the dimensions of which are scalable as a function of the applications in terms of occupied area and of the current to be carried. The vias openings 3 may be realized, for example, by reactive ion etching (RIE) in oxygen plasma. PMMA (polymethylmethylacrylate) (mr-i PMMA 35 k 300) deposited by spin coating and thermally treated at 150° C. for 2 minutes has been used as the dielectric layer material through which the vias are made. Localization of the RIE etching has been made possible by a resist mask defined photolithographically (positive photoresist Fujifilm Oir 906-12). In order to obtain a uniform deposition of the photoresist on the PMMA, the surface of the latter was treated by RIE in oxygen plasma (30 W, 100 sccm, 0.1 mbar, t=30 s). The photoresist was exposed through the lithographic mask to UV radiation having a wavelength of 365 nm (15 mW/cm$^2$ for 2.7 s) and developed in the solution Fujifilm OPD 4262 for 50 s. Through the openings of the mask, the dielectric was etched off from the unprotected areas by RIE attack in oxygen plasma at 100 W, 10 sccm and 0.07 mbar for a time of t=120 s, sufficient to remove completely the layer of 300 nm of PMMA. Once the vias are formed, the resist mask was removed by exposing it to UV and successive development according to the same conditions described above. An exemplary opening of vias is shown in FIG. 4.

Figure 5:
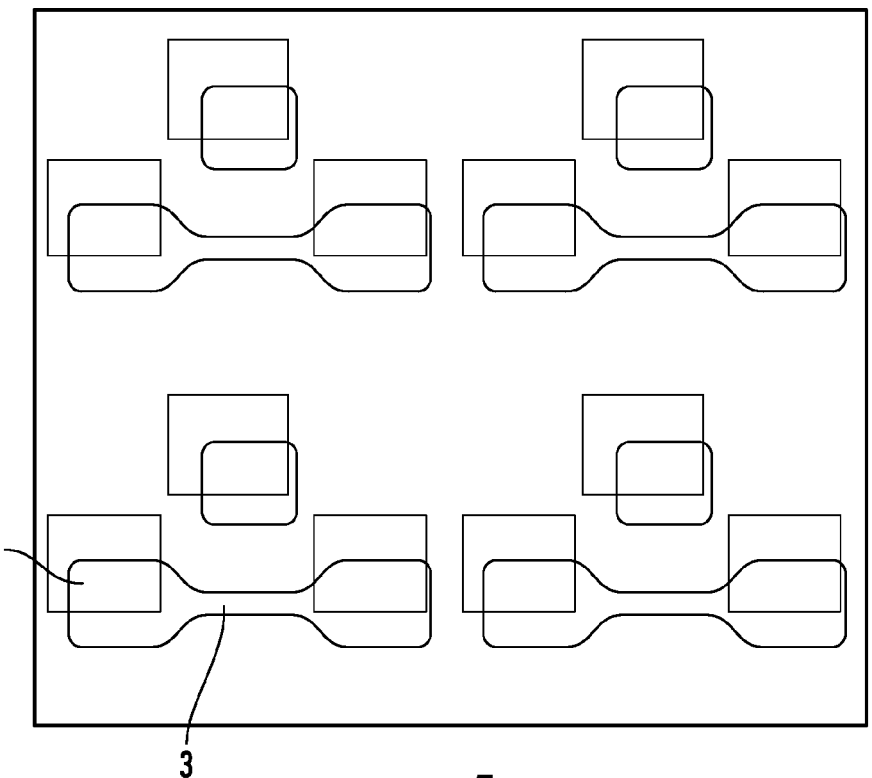
FIG. 5 is a picture taken with an optical microscope of a PMMA (mr-i PMMA 35 k 300) structured through NIL with vias aligned to the PAD of the previously fabricated base electrodes, according to the present invention.

Alternatively, the vias aperture 3 in the layer of dielectric material may be carried out through a NanoImprinting Lithography process based on printing under appropriate pressure and temperature through a mold having protruding structures in correspondence of points in which the vias are to be opened. Successively to the printing process, the indented (structured) zones have a relatively thin residual layer of polymer to be removed in order to expose the electric contact areas over respective base (or bottom) electrodes. In order to etch off this thinned layer, a Reactive Ion Etching (RIE) process with an oxygen plasma is used. FIG. 5 is a picture taken with an optical microscope of an exemplary PMMA (mr-i PMMA 35 k 300) structured through NIL with a silicon mold at T=190° C., p=50 bar, t=5 min with vias 3 aligned to a pad area (PAD) of base electrodes 4. The residual thinned layer of PMMA was removed with oxygen plasma (100 W, 10 sccm, 0.07 mbar, t=50 s).

Figure 6:
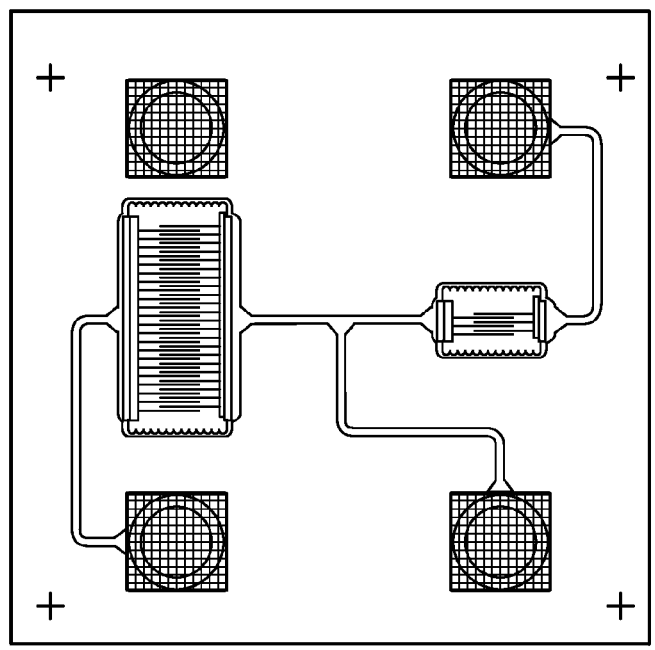
FIG. 6 is a picture taken with an optical microscope of a structure with four vias filled with PEDOT:PSS (Baytron PJET HC) through inkjet printing by means of a JETLABII of Microfab, according to the present invention.

FIG. 6 is a picture taken with an optical microscope of a PMMA (mr-i PMMA 35 k 300) structured through NIL with vias aligned to the PAD of base electrodes. The sides of the depicted vias were of 50 μm. FIG. 6 depicts an example of vias filled with PEDOT:PSS (Baytron PJET HC) through inkjet printing using a JETLABII of Microfab. After the deposition of the PEDOT:PSS in the vias, the metallization process is carried out, followed by the definition of upper electrodes through a high definition lithographic techniques such as optical, soft lithography, laser ablation or NanoImprinting Lithography.

Figure 7:
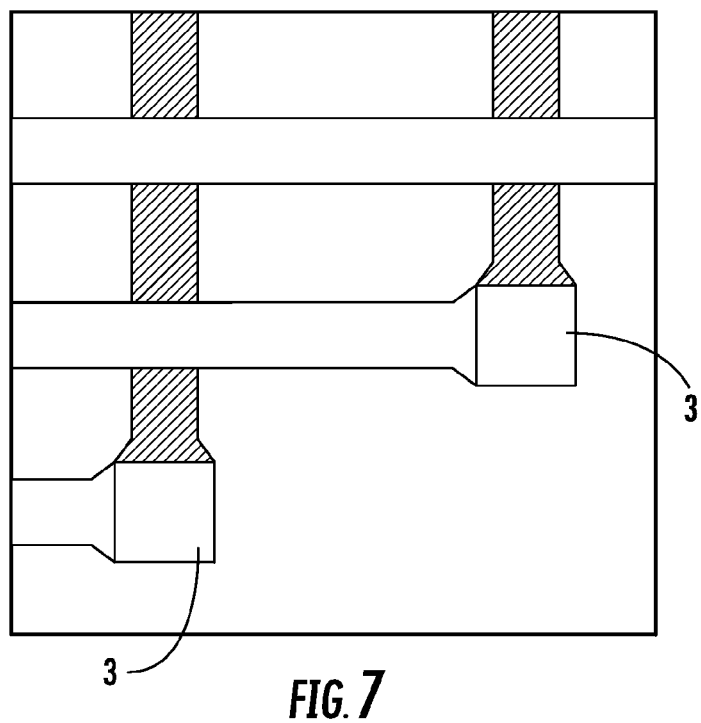
FIG. 7 is a picture taken with an optical microscope of two vertical interconnections that contact conductive gold lines of two different metal levels, as may be recognized by the different color tonalities, according to the present invention.

FIG. 7 depicts two vertical interconnections 3 that contact conductive lines of gold disposed on two different metal levels of a stack, as may be observed by the different color tonalities.

Figure 8:
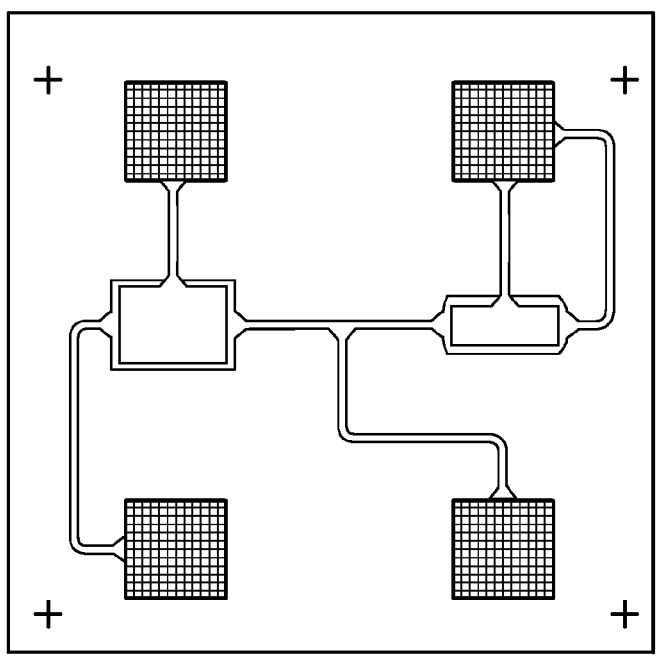
FIG. 8 is a picture taken with an optical microscope of a circuit used for testing the functioning of devices and of the horizontal and vertical interconnections thereof, according to the present invention.

FIG. 8 depicts a circuit used for testing the functioning of devices and of the relative horizontal and vertical interconnections, wherein the gate electrode of the second transistor is shorted through the PEDOT:PSS via to the drain electrode, realizing an efficient interconnection between the layers, helping to ensure electrical continuity with the defined upper electrode. The presence of PEDOT: PSS at the contact interfaces does not detract to the robustness of the interconnection that shows undiminished resistance to the mechanical stresses due to the pressure of the metal tipped probe during test operations.

As stated above, the upper metal electrodes, besides by optical lithography, may be alternatively structured by techniques such as SL and NL. These techniques allow sub-micrometrical resolutions and, in respect to optical lithography, reduce the number of process steps and chemical agents to be used.

Figure 9:
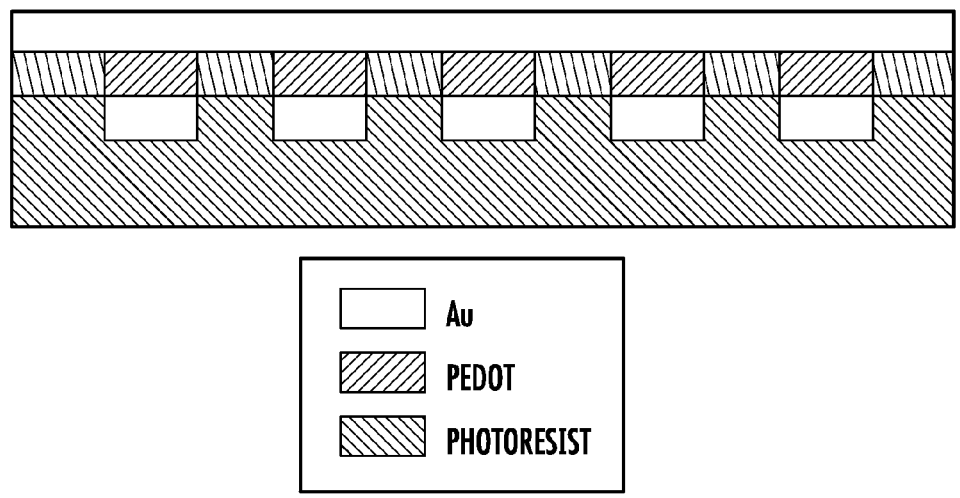
FIG. 9 illustrates a test architecture used for verifying the contact resistance characteristics between the post deposited metallization layer and the consolidated conductive filler material of the vias, according to the present invention.

In order to verify properties of the vias filled with a conductor PEDOT:PSS, the electric properties of the composite conductor Au/PEDOT:PSS/Au have been verified in a structure similar to that to be used for the vertical interconnection of metal pads of different metal layers of an integration stack. For the electric characterization of these structures a test apparatus including a Parameter Analyzer (4155C Agilent) and a Probe Station (model PM5 Karl Suss) equipped with micromanipulators, that allows to contact integrated devices by metal probes of radius smaller than 1 μm, has been used. Using the device schematized in FIG. 9, the continuity of the Au film deposited on the vias and of the interconnections realized through these vias has been verified. On a glass substrate electrodes of Au of area 50×50 μm$^2$ have been deposited, above these electrodes separated vias defined through a photoresist layer have been formed and successively filled with PEDOT:PSS. Thereafter, a continuous film of Au was deposited over them.

Electric tests have shown the continuity of the depicted upper electrode of Au with a resistivity ρ of about 10$^{-5}$ Ωcm, comparable with that of metallic gold. This value of resistivity of the deposited film of gold indicates that the vias of PEDOT: PSS enhance the continuity of the deposited metal film and do not affect the electrical conductivity of the film of deposited gold. The resistivity of the deposited upper metal electrode was calculated on the base of the resistance value R measured with a four contact scheme and using the formula R=ρl/A wherein l is the length of the electrode and A its section. The test on the single vias allowed to verify that the PEDOT:PSS fills completely the via, effectively connecting together the upper and the lower metal electrodes, with a conductivity of several S/cm, according to the expected value estimated in function of the conductivity values of the used PEDOT:PSS. The successful functioning of the vias has been verified even in more complex devices where different layers were similarly interconnected.

In particular, in the device of FIG. 8, the gate electrode of the second transistor was shorted through the via to the drain electrode. The via of PEDOT: PSS realizes an excellent vertical interconnection between the different layers without negatively affecting electrical conductivity of the upper electrode.

Other Exemplary Conducting Inks

Alternatively, the filling of the vias may also be realized with colloidal suspensions of nanometric or submicrometric metal particles. In this case, use of nanoparticles of Au or Ag passivated by an organic layer is highly preferable. The function of a passivation layer is twofold: favoring dispersion of the nanoparticles in organic solvents thus preventing untimely aggregation phenomena that would lead to the bulk metal. As far as the use of Au particles suspension is concerned, hereinafter are exemplary techniques:

Synthesis of Metal Nanoparticles

The nanoparticles may be prepared through chemical reduction of Au (II) to elementary Au in a liquid biphasic system of gold salts. For example: to 80 ml of a solution 50 mM of tetraoctylammonium bromide 30 ml of an aqueous solution 30 mM of $HAuCl4:3H2O$, 170 mg of dodecanthiol are added to the biphasic suspension and, under vigorous shaking, 25 ml of a solution 0.4 M of sodium borohydride are added. Shaking is protracted for about three hour and at the end the organic phase is recovered and concentrated up to obtain a volume of 10 ml. The colloidal suspension is then purified with ethanol, in order to remove dodecanthiol in excess. A suspension in toluene/ethanol is kept at −18° C. for 4 h and the resulting dark precipitate is filtered under vacuum and washed with different concentrations of ethanol.

Preparation of the Ink

A suspension at 10% weight of nanoparticles of Au in α-terpienol is prepared, such to obtain a suspension with viscosity generally not greater than 20 cP.

Deposition by IJP

The conducting ink is deposited by ink jet printing in previously prepared vias. The deposition, accompanied by evaporation of the solvent, produces a layer of closely packed metal nanoparticles self arranged in regular and homogeneous lattice by virtue of interactions among the surface passivating molecules. Such an organization of nanoparticles leads to the generation of a compact hexagonal crystalline super-lattice and because of this closely packed organization of the gold particles, the film is electrically conductive through electronic hopping/tunneling mechanisms.

In order to obtain a highly conductive electrically continuous metal filler of vias it is helpful to promote coalescence and "sintering" of the nanoparticles, achieved by heating the print deposited and dried filled to favor elimination of residual solvent content, induce desorption of the organic layer and promote a "sintering" of the metal particles to an almost bulk metal form. Post deposition, treatment temperature may vary from about 180° C. to about 300° C.

The above disclosed example represents a general sequence that may be followed even modifying certain parameters, such as the type of passivating agent, type of solvent of the conducting ink, concentrations of reactants during the synthesis of nanoparticles and thus their size at the end of the chemical process. An alternative to the use of inks based on nanoparticles of Au the use of inks of nanoparticles of Ag, that have the advantage of "sintering" at lower temperatures, thus being more compatible with materials of the integration stack.

Synthesis of Metal Nanoparticles of Ag 8.5 g of neodecanoic acid are added to 20 ml of aqueous solution of 7% NaOH. To the resulting mixture 20 ml of an aqueous solution containing 8.5 g of silver nitride are added. The mixture is agitated up to the formation of a white precipitate composed of Ag neodecanoate. The precipitate is recovered by filtration, suspended in ethanol and kept under agitation for three hours, then filtered again and washed repeatedly with ethanol and acetone. Nanoparticles of Ag are formed by adding 100 ml of a solution of toluene containing 0.98 ml of phenilhydrazine to a solution of Ag neodecanoate dispersed in the toluene. After magnetic shaking for one hour, a dark precipitate is formed, that is successively filtered and washed repeatedly with methanol and dried under vacuum at 30° C. for 12 hours.

Preparation of the Ink

Suspensions in alcoholic (IPA) or aromatic hydrocarbon solvents (toluene and xylene) may be prepared with up to 20% by weight of nanoparticles of Ag, producing a suspension with viscosity generally not greater than 20 cP.

Deposition by IJP

The conductive ink is deposited by ink jet printing in the previously prepared vias. Deposition, accompanied by evaporation of the solvent produces a filler of nanoparticles of Ag coated with an organic layer of neodecanoic acid stabilizing agent. Similarly to what described for the nanoparticles of Au, also the closely packed lattice filler of nanoparticles of Ag is electrically conductive and may even be used as such without any heat treatment of "sintering" to an almost bulk metal form. Preferably, the deposited material may be heated up to about 130° C. to favor elimination of residues of solvent, induce desorption of the organic layer and promoting sintering of metal particles.

Another alternative includes using inks based on mercaptures. Mercaptures, called also thiolates, are products of salification of thiols. Through appropriate choice of the thiol they may be made compatible with solvents of any kinds; moreover, they are moderately thermolabiles compounds, i.e. they decompose, freeing metal atoms, when heated up to a temperature range from about 200 to about 300° C., through the following reaction scheme: $Me(SR)2 \rightarrow Me+R-S-S-R$.

For synthesizing mercaptures, an alcoholic (ETOH) or alkaline solution of mercaptan is prepared and an organic or inorganic salt of the transition metal (e.g. nitride, acetate, chloride, etc.) is added thereto. Successively, the metallic mercapture is separated, as precipitate, from the reaction environment.

Salt dissolution: $MeXn \rightarrow Men+ +nX-$

Precipitation of mercapture: $Men++ n R-S-\rightarrow Me(SR)n$

Because of the presence of vacant orbital on the metal atom (d and f) and of single electronic pairs on the sulfur atoms, the metal mercapture tends to forms polymeric structures: $m\ Me(SR)n \rightarrow poly-Me(SR) n$ The polymeric nature of the precursor, as well as the possibility of choosing the type of thiol that makes possible the solubilization into different types of solvents and thus in solvents that do not dissolve the dielectric polymer in which the via-holes are fabricated. The required temperature of thermal decomposition of mercapture depends on the size of R; the larger the dimension of R, the higher the temperature required for decomposing the compound because the molecular fragments must possess a sufficiently high kinetic energy in order to part.

Pre-Treating of Critical Surfaces

Before filling the vias with the conducting material, surface treatments may be carried out for favoring wettability and compatibility at the bottom electrode interface. Treatments are executed such to preserve the already realized integrated structures.

For polar inks such as the PEDOT: PSS a useful surface treatment adapted to improve interfacing is that already described, in oxygen plasma (Reactive Ion Etching, P=30 W, 100 sccm, 0.1 mbar, t=30 s) that removes eventual organic residues and in case of grid electrodes favors the formation of hydrophilic groups OH on non conductive portions of the area constituted by the substrate that may be glass or an organic polymer.

As an alternative, a chemical wet treatment of the surfaces may be carried out, using a solution of an appropriate reactant specific for the type and chemical nature of the surfaces. In particular, in order to modify metal surfaces such as Au and Ag, passivation with alkanthiols is used, that is with organic molecules having a terminal thiolic group capable of forming covalent bonds with the metal surface according to the following reaction:

$$RSH + Au(0)n \rightarrow RS-Au(I)Au(0)n-1 + \tfrac{1}{2} H2$$

wherein R is an alkylic radical, that is a hydrocarbon chain that may confer hydrophobicity or hydrophilicity to the metal surface depending on the functional groups. Passivation of the metal surface is favored by a self-assembling process of the organic molecules to form a highly homogeneous and ordered organic monolayer. The presence of functional groups on the hydrocarbon chain R, such as hydroxylic, carboxylic, aminic, nitrilic residual makes hydrophilic the metal surface; by contrast, apolar groups of alkylic or aromatic nature make the surface hydrophobic. Glass surfaces or SiO2 based surfaces may be simultaneously functionalized, through a silanization process in liquid phase by using alkylchlorinesilanes or alkyletoxysilanes. Also with this treatment, formation of covalent bonds is promoted and generally it is done for conferring hydrophobicity to the surface destined to receive the conductive ink.

In case of grid bottom contacts, in order to improve wettability by the conductive inks printed inside the vias, the metallic portions as well as the surface of the substrate may be chemically treated using appropriate modifiers mainly in function of the chemical nature of the solvent of the ink. If, for example, the solvent of the conducting ink is a-polar, an a-polar alkanthiol is used as passivating agent, for example dodecanthiol, then executing silanization of the glass surface through silanization reactions with OTS (octadecyltrichlorinesilane) or PFBTetoxSi (pentafluorinebenzenetrietoxysilane), and passivation of gold parts with PBFT (pentafluorinebenzenethiol) taking care of using H-Galden ZV60 as solvent, a polyether perfluoride of low molecular weight which may not alter a PMMA that may have been chosen as dielectric of the insulating layer for fabricating the device. In particular, the following conditions may be adopted:
silanization: OTS/PFBTetoxSi 2 mM in H-Galden ZV60 (Solvay), immersion of the samples for 12 hours, environment temperature;
Au passivation: PBFT 10 mM in H-Galden ZV60 (Solvay), immersion of samples for 12 hours, environment temperature.

As an alternative, for inks with polar solvents such as the previously described PEDOT: PSS, it is possible to use mercaptanalkylic acids, e.g. 12-mercaptandodecanoic acid, for passivating gold surfaces.

The process of formation of vertical interconnections, based on definition with "two distinct technologies", respectively for realizing vertical interconnections and conducting structures at a certain level of an integration stack of an electronic circuit or device, besides that for stacks comprising polymeric organic material, may be used mutatis mutandis also for stacks comprising semiconducting layers and/or dielectrics of inorganic materials associated or not to layers of organic materials.

The invention claimed is:

1. A method for forming a vertical interconnection through a dielectric layer between upper and lower electrically conductive layers of an integrated circuit, the method comprising:
forming an opening through the dielectric layer;
placing a solidifiable electrically conductive filler into the opening via a printing technique;
solidifying the solidifiable electrically conductive filler to thereby form a solidified electrically conducting filler in the opening;
forming a metallization layer over the dielectric layer and the solidified electrically conducting filler to thereby form the vertical interconnection through the dielectric layer between the upper and lower electrically conductive layers of the integrated circuit; and
treating at least one of a bottom surface and a sidewall surface of the opening prior to placing the solidifiable electrically conductive filler.

2. The method of claim 1, wherein the metallization layer is formed by optical lithography.

3. The method of claim 1, wherein the opening is formed by etching the dielectric layer.

4. The method of claim 1, wherein the solidifiable electrically conductive filler comprises one of an electrically conductive paste and an electrically conductive ink.

5. The method of claim 1, wherein the printing technique comprises inkjet printing; and wherein the solidifiable electrically conductive filler comprises at least one of a fluid electrically conductive polymeric material, a colloidal suspension of metallic nanoparticles, and a colloidal suspension of a reducible metal salt.

6. The method of claim 1, wherein the printing technique comprises inkjet printing; and wherein the solidifiable electrically conductive filler comprises at least one of a colloidal suspension of a conductive organic-metallic compound, a solution of a reducible metal salt, and a solution of a conductive organic-metallic compound.

7. The method of claim 1, wherein the bottom surface and the sidewall surface of the opening are treated using oxygen plasma prior to placing the solidifiable electrically conductive filler.

8. The method of claim 1, wherein the dielectric layer comprises an organic dielectric layer.

9. The method of claim 1, wherein the dielectric layer comprises an inorganic dielectric layer.

10. The method of claim 1, wherein the solidifiable electrically conductive filler comprises a solution; and further comprising treating a bottom surface a sidewall surface of the opening with a solution of a functionalizing agent adapted to whether a solvent of the solidifiable electrically conductive filler has a polar nature.

11. The method of claim 10, wherein the bottom surface of the opening is at least partly metallic and the functionalizing agent comprises at least one of an alcantiol, a linear apolar alchilic, a branched apolar alchilic, a hydroxylic, a carboxylic, an amminic, and a polar nitrilic.

12. The method of claim 10, wherein the bottom surface of the opening is at least partly metallic and partly a vitreuos inorganic dielectric.

13. The method of claim 10, wherein the functionalizing agent includes at least a silanizing compound.

14. The method of claim 1, wherein the solidifiable electrically conductive filler comprises poly(3,4-ethylenedioxythiophene)poly(styrenesulfonate).

15. The method of claim 1, wherein the solidifiable electrically conductive filler comprises a colloidal suspension of nanoparticles of gold.

16. The method of claim 1, wherein the solidifiable electrically conductive filler comprises a colloidal suspension of nanoparticles of silver.

17. The method of claim 1, wherein solidifiable electrically conductive filler comprises a solution of reducible organometallic salts.

18. The method of claim 1, wherein the printing technique comprises aerosol printing.

19. The method of claim 1, wherein the opening is formed by at least one of reactive ion etching, solvent jets, and laser ablation.

20. A method for forming a vertical interconnection through a dielectric layer between upper and lower electrically conductive layers of an integrated circuit, the method comprising:
   forming an opening through the dielectric layer;
   placing an electrically conductive ink into the opening via inkjet printing;
   solidifying the electrically conductive ink to thereby form a solidified electrically conducting filler in the opening;
   forming a metallization layer over the dielectric layer and the solidified electrically conducting filler to thereby form the vertical interconnection through the dielectric layer between the upper and lower electrically conductive layers of the integrated circuit; and
   treating at least one of a bottom surface and a sidewall surface of the opening prior to placing the electrically conductive ink.

21. The method of claim 20, wherein the opening is formed by etching the dielectric layer.

22. The method of claim 20, wherein the electrically conductive ink comprises at least one of a fluid electrically conductive polymeric material, a colloidal suspension of metallic nanoparticles, and a colloidal suspension of a reducible metal salt.

23. The method of claim 20, wherein the electrically conductive ink comprises at least one of a colloidal suspension of a conductive organic-metallic compound, a solution of a reducible metal salt, and a solution of a conductive organic-metallic compound.

24. The method of claim 20, wherein the bottom surface and the sidewall surface of the opening are treated using oxygen plasma prior to placing the electrically conductive ink.

25. The method of claim 20, wherein the opening is formed by at least one of optical lithography, reactive ion etching, solvent jets, and laser ablation.

26. A method for forming a vertical interconnection through a dielectric layer between upper and lower electrically conductive layers of an integrated circuit, the method comprising:
   forming an opening through the dielectric layer by etching the dielectric layer;
   placing an electrically conductive ink into the opening via inkjet printing;
   solidifying the electrically conductive ink to thereby form a solidified electrically conducting filler in the opening; and
   forming a metallization layer over the dielectric layer and the solidified electrically conducting filler by optical lithography to thereby form the vertical interconnection through the dielectric layer between the upper and lower electrically conductive layers of the integrated circuit.

27. The method of claim 26, wherein the solidifiable electrically conductive filler comprises at least one of a fluid electrically conductive polymeric material, a colloidal suspension of metallic nanoparticles, and a colloidal suspension of a reducible metal salt.

28. The method of claim 26, further comprising treating a bottom surface and a sidewall surface of the opening using oxygen plasma prior to placing the electrically conductive ink.

29. The method of claim 26, wherein the electrically conductive ink comprises at least one of a fluid electrically conductive polymeric material, a colloidal suspension of metallic nanoparticles, and a colloidal suspension of a reducible metal salt.

30. The method of claim 26, wherein the electrically conductive ink comprises at least one of a colloidal suspension of a conductive organic-metallic compound, a solution of a reducible metal salt, and a solution of a conductive organic-metallic compound.

* * * * *

UNITED STATES PATENT AND TRADEMARK OFFICE
CERTIFICATE OF CORRECTION

| | | |
|---|---|---|
| PATENT NO. | : 8,062,976 B2 | Page 1 of 1 |
| APPLICATION NO. | : 12/844347 | |
| DATED | : November 22, 2011 | |
| INVENTOR(S) | : Vecchione et al. | |

It is certified that error appears in the above-identified patent and that said Letters Patent is hereby corrected as shown below:

Column 1, Line 51    Delete: "vias"
                     Insert: --via--

Column 1, Line 64    Delete: "Jul. 10, 2001 In"
                     Insert: --Jul. 10, 2001. In--

Column 2, Line 53    Delete: "vias"
                     Insert: --via--

Column 3, Line 3     Delete: "photolitographic"
                     Insert: --photolithographic--

Column 3, Line 7     Delete: "photolitographic"
                     Insert: --photolithographic--

Column 6, Line 7     Delete: "through a high"
                     Insert: --through high--

Column 7, Line 28    Delete: "hour"
                     Insert: --hours--

Column 10, Line 54   Delete: "surface a sidewall"
                     Insert: --surface and a sidewall--

Signed and Sealed this
Twenty-fourth Day of July, 2012

David J. Kappos
*Director of the United States Patent and Trademark Office*